(12) United States Patent
Choy et al.

(10) Patent No.: US 6,331,330 B1
(45) Date of Patent: Dec. 18, 2001

(54) FILM OR COATING DEPOSITION AND POWDER FORMATION

(75) Inventors: Kwang-Leong Choy, Coventry; Wei Bai, London, both of (GB)

(73) Assignee: Imperial College of Science, Technology, and Medicine, London (GB)

(*) Notice: Subject to any disclaimer, the term of this patent is extended or adjusted under 35 U.S.C. 154(b) by 0 days.

(21) Appl. No.: 09/091,456

(22) PCT Filed: Dec. 16, 1996

(86) PCT No.: PCT/GB96/03105

§ 371 Date: Dec. 21, 1998

§ 102(e) Date: Dec. 21, 1998

(87) PCT Pub. No.: WO97/21848

PCT Pub. Date: Jun. 19, 1997

(30) Foreign Application Priority Data

Dec. 14, 1995 (GB) .................................................. 9525505
Aug. 16, 1996 (GB) .................................................. 9617248
Sep. 13, 1996 (GB) .................................................. 9619146

(51) Int. Cl.⁷ ........................................................ B05D 1/04
(52) U.S. Cl. ........................ 427/475; 427/483; 427/485; 427/598; 427/314
(58) Field of Search ........................ 427/475, 480, 427/481, 483, 484, 485, 486, 598, 585, 314

(56) References Cited

U.S. PATENT DOCUMENTS 4,921,731 * 5/1990 Clark et al. .
5,298,277 * 3/1994 Hirose .
5,344,676 * 9/1994 Kim et al. .

FOREIGN PATENT DOCUMENTS

| 43 32 890 A1 | 3/1994 | (DE) . |
| 0 103 505 A1 | 3/1984 | (EP) . |
| 0 252 755 * | 1/1988 | (EP) . |
| 0 252 755 A1 | 1/1988 | (EP) . |

OTHER PUBLICATIONS

Ryu et al., "Fabrication of ZnO thin films using charged liquid cluster beam technique", Applied Physics Letters, vol., 67, No. 22, pp. 3337–3339, Nov. 27, 1995.

Salata et al., "Fabrication of CdS nanoparticles embedded in a polymer film by gas–aerosol reactive electrostatic deposition technique", Thin Solid Films, vol. 251, No. 1, pp. 1–3, Oct. 15, 1994.

Viguie et al., "Chemical Vapor Deposition at Low Temperatures", Journal of the Electrochemical Society, vol. 122, No. 4, pp. 585–588, Apr. 1, 1975.

Blandenet et al., "Thin Layers Deposited by the Pyrosol Process", Thin Solid Films, vol. 77, pp. 81–90, 1981.

* cited by examiner

Primary Examiner—Fred J. Parker

(57) ABSTRACT

Methods for depositing a material onto a substrate include the steps of: feeding a material solution including one or more precursor compounds, a solvent and a pH-modifying catalyst to an outlet to provide a stream of droplets of the material solution; generating an electric field to electrostatically attract the droplets from the outlet towards the substrate; and providing an increase in temperature between the outlet and the substrate.

34 Claims, 11 Drawing Sheets

CORONA FIELD DIRECTION ←

FILM OR COATING DEPOSITION AND POWDER FORMATION

FIELD OF THE INVENTION

This invention relates to film or coating deposition and powder formation.

Ceramic, polymer and other films, coatings and powders are used in, for example, structural and functional electronic applications.

BACKGROUND

As background, the distinction between a film and a coating is very loosely defined and is not important to the operation or description of the present invention. In one definition, a film would be considered as a layer under about 10 μm thick, and a coating would be of greater thickness. In the present description, however, the terms are generally used interchangeably.

The following are examples of previously proposed techniques for generating such films, coatings and powders: physical vapour deposition (PVD) (a generic term given to a variety of sputtering techniques such as radio frequency (RF) sputtering, reactive magnetron sputtering and ion beam sputtering); flame spray deposition (FSD); the so-called sol-gel process; electrostatic spray pyrolysis (ESP); and chemical vapour deposition (CVD). Two particular examples are disclosed in EP-A-0 103 505 and Applied Physics Letters, Vol. 67, No. 22, November 1995, pp 3337–3339.

However, none of these techniques has been found to provide good control of the stoichiometry, morphology, microstructure and properties of multicomponent oxide films and a relatively high growth rate and deposited area of a deposited film. Also, the CVD and PVD techniques tend to need expensive equipment and highly skilled technicians for effective operation.

SUMMARY OF THE INVENTION

This invention provides a method of depositing a material onto a substrate, the method comprising the steps of:

feeding a material solution comprising one or more precursor compounds, a solvent and a pH-modifying catalyst to an outlet to provide a stream of droplets of the material solution;

generating an electric field to electrostatically attract the droplets from the outlet towards the substrate; and providing an increase in temperature between the outlet and the substrate.

Further respective aspects of the invention (to which the various preferred features are equally applicable) are defined in the appended claims.

Embodiments of this method, which will be referred to hereinafter as electrostatic spray assisted vapour deposition (ESAVD), enable the fabrication of both thin and thick films. The technique combines the advantages of CVD and electrostatic spray deposition whilst alleviating the problems associated therewith. In comparison to other film deposition techniques, ESAVD has a high deposition rate and efficiency, and allows easy control of the stoichiometry and microstructure of the deposits. In addition, it is a simple, cheap, and low-temperature synthesis method suitable for the fabrication of a variety of different films. The method also allows the deposition of a film on large surface area substrates.

The use of the pH-modifying catalyst (which can be acid or alkali) can provide a clearer solution with increased electrical conductivity, and so can give finer droplets and thus a better coating quality.

The method can be performed so that the substrate and other pieces of apparatus are open to the surrounding ambient atmosphere, the other ambient gaseous reactants refer to any other gaseous reactants (such as oxygen, for example) that may be present in the atmosphere. In another embodiment, the method may performed within the confines of a container and said other ambient gaseous reactants may be supplied to said container, thereby to enable the deposition of a particular film.

Both simple and multicomponent ceramic oxide films have been fabricated using the above mentioned method. In one embodiment, the film may be a ceramic film such as PZT (Lead Zirconate Titanate) or a doped film such as YSZ (Yttria Stabilised Zirconia). Other films may include $PbTiO_3$, $BaTiO_3$, $La(Sr)MnO_3$, $NiO-YSZ$, $SnO_2-In_2O_3$ and other Indium-Tin Oxide films. The film may also be a structural and/or functional film such as an electroceramic film.

Preferably, the droplets are charged to a voltage within the approximate range 5–30 kilovolts with respect to the substrate.

In one embodiment, the temperature increases gradually to a temperature in the approximate range 100 to 650 degrees celsius (the temperature used may depend on the type of coating). Varying the processing parameters enables the production of dense porous and/or thin/thick films all of which have good adhesion to the substrate.

Preferably, the film has a thickness between a nanometer and approximately 100 micrometers, or much thicker.

In any of the above embodiments, the catalyst may be an acid such as ethanoic acid or hydrochloric acid. In this case, the required pH may be between 2 and 5.

Alternatively, the catalyst may be an alkali such as $NH_3$. In this case, the required pH may be between 9 and 12.

The invention can be particularly useful for producing polymer coatings, in which case it is preferred that the electric field is maintained during at least part of the time during which the substrate cools down after coating has been performed. This can urge the polymer into a desirable polar structure.

BRIEF DESCRIPTION OF THE DRAWINGS

The invention will now be described, by way of example only, with reference to the accompanying drawings in which.

DETAILED DESCRIPTION

In a first embodiment a coating solution is deposited to form a ceramic film on a substrate.

Figure 1:
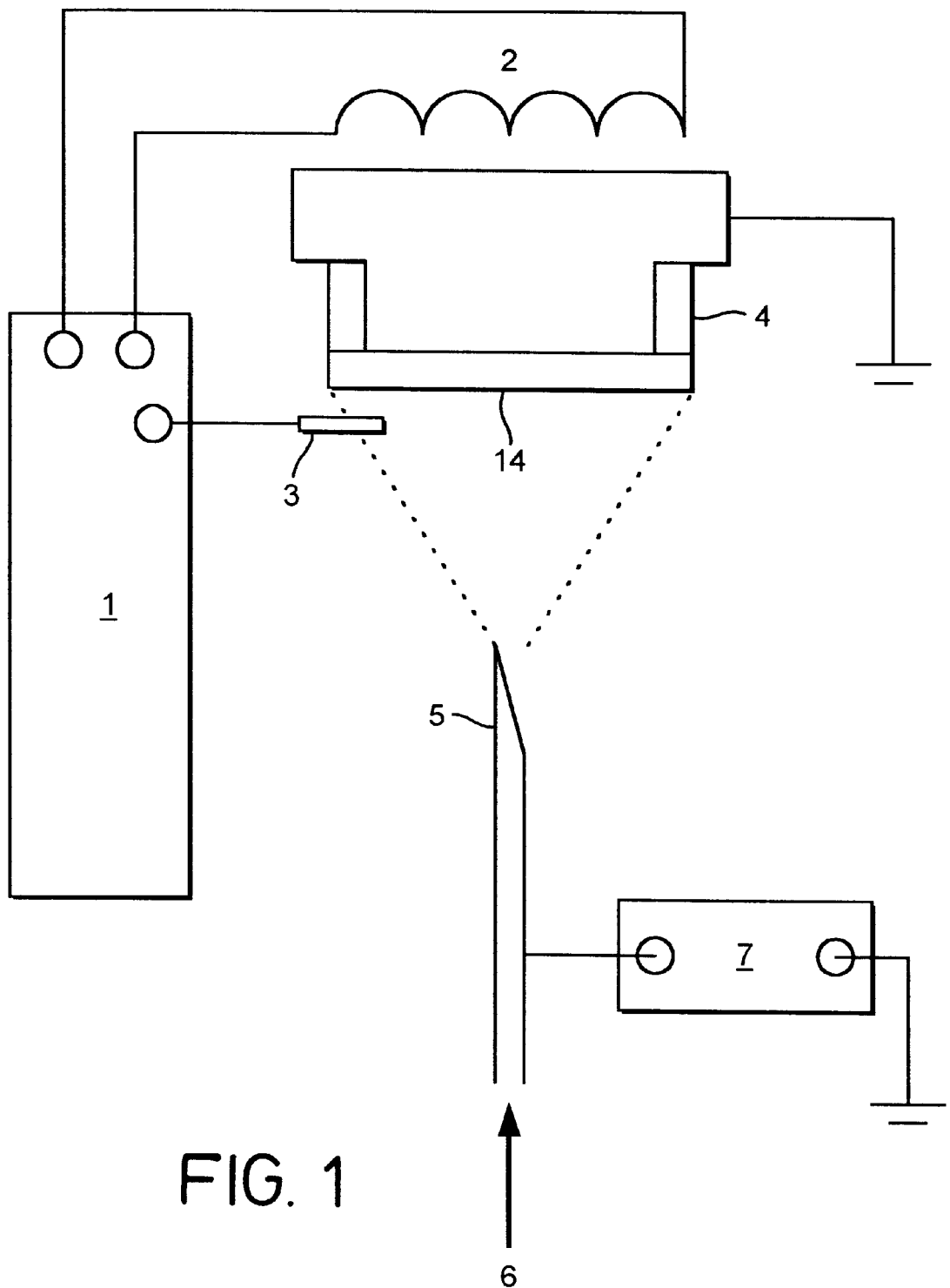
FIG. 1 illustrates schematically an apparatus for use in electrostatic spray assisted vapour deposition of a film on a substrate.

A film deposition apparatus as shown schematically in FIG. 1 comprises an outlet (e.g. a nozzle, spray or similar) 5 connected to a high voltage DC source 7 preferably variable in the range 0–30 kV. In operation, a voltage of between 5 and 30 KV would be normally used for the apparatus as shown. A substrate holder 4 is earthed and is heated by a heater 2. The temperature of the substrate holder 4 is controlled by the controller 1 and an attached thermocouple 3.

Heating the substrate holder also causes a corresponding heating of the area surrounding the substrate 14 and between the substrate holder and the outlet 5. This heating serves to set up a temperature gradient whereby the ambient temperature increases as the substrate is approached from the direction of the outlet. This increasing temperature facilitates a chemical vapour reaction (see FIG. 3) of the coating solution that enables deposition of the ceramic film.

When an electric field of sufficient strength is applied to the outlet 5, a corona field is produced from the tip of the outlet 5. A ceramic coating liquid is used to form the films and is fed into the outlet 5 in the direction indicated by an arrow 6.

The outlet's inner diameter can vary from 1 mm (millimeter) to 0.1 mm. This relatively large inner diameter reduces the chances of clogging problems when high viscosity solutions are passed through the outlet 5.

A substantially constant flow in the range of 0.4–60 ml/h (milliliters per hour) is maintained by use of a syringe pump or a constant static pressure feed.

In this way, the electrostatic field set up between the charged outlet 5 and the earthed substrate holder 4 serves to guide charged coating solution droplets to the substrate 14. Droplets of the coating solution are provided with a positive charge by way of the high voltage DC source 7. These positively charged droplets are attracted to the earthed substrate holder 4. (As an alternative, of course, the droplets could be negatively charged with an earthed holder 4, or vice versa).

Figure 2:
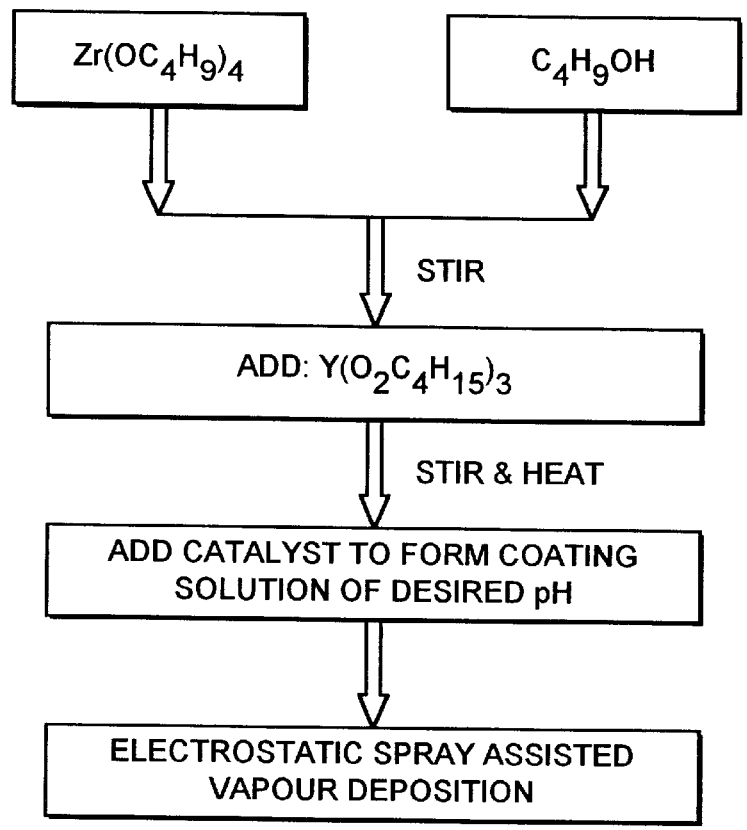
FIG. 2 is a flow chart that illustrates schematically steps in the synthesis of coating solution for the electrostatic spray assisted vapour deposition of YSZ.

FIG. 2 schematically illustrates steps in the preparation of one type of coating solution for the deposition of YSZ (Yttria Stabilised Zirconia). First, a precursor compound (in this case, $Zr(OC_4H_9)_4$) is mixed with a solvent (in this case, Butanol-$C_4H_9OH$). This solution is stirred and a second precursor compound $Y(O_2C_4H_{15})_3$ (more generally, a metal alkoxide or an organometallic compound) is added under action of heat. The mixture is then catalysed to form a coating solution of the desired pH. In this case, ethanoic acid ($CH_3COOH$) is used as a catalyst, but other acids (such as HCl) or alkalis (such as $NH_3$) may be used in the preparation of alternative coating solutions. In the case of acid catalysed reactions, the desired pH may be between 2 and 5. In the case of alkali catalysed reactions, the desired pH may be between 9 and 12.

The coating solution, a mixture of $Zr(OC_4H_9)_4$, Butanol and $Y(O_2C_4H_{15})_3$, is then passed to the outlet 5 and discharged towards the substrate 14.

Preferably, the concentration of the desired coating solution is approximately 0.01–0.5 mol/l (moles per liter). In addition, the coating solution may have a viscosity in the region of about 0.01 to 50 mPa.S (millipascal seconds) depending on the type of film that it is desired to produce.

Table 1 shows the compositions of coating solutions for various deposited films.

TABLE 1

| Film | 1st Precursor | 2nd Precursor | Further precursors | Solvent | Catalyst |
|---|---|---|---|---|---|
| PZT | $Pb(CH_3CO_2)_2$ & $Zr(OC_3H_7)_4$ | $Ti(OC_3H_7)_4$ | | $CH_3OCH_2CH_2OH$ | Ethanoic Acid |
| $PbTiO_3$ | $Pb(CH_3CO_2)_2$ | $Ti(OC_3H_7)_4$ | | $CH_3OCH_2CH_2OH$ | Ethanoic Acid |
| $BaTiO_3$ | $Ba(CH_3CO_2)_2$ | $Ti(OC_3H_7)_4$ | | $CH_3OCH_2CH_2OH$ | Ethanoic Acid |
| $SnO_2$—$In_2O_3$ | $In(NO_3)_3.xH_2O$ | $SnCl_2$ | | Ethanol | Ethanoic Acid |
| La(Sr)$MnO_3$ | $La(NO_3)_3.xH_2O$ & $Mn(NO_3)_2.6H_2O$ | $SrNO_3$ | | 20% $H_2O$ and about 80% ethanol | Ethanoic Acid |
| YSZ | $Y(O_2C_8H_{15})_3$ | $Zr(OC_4H_9)_4$ | | Propanol or Butanol | Ethanoic Acid |
| YSZ | $Y(O_2C_8H_{15})_3$ | $Zr(OC_3H_7)_4$ | | Propanol or Butanol | Ethanoic Acid |
| NiO-YSZ | $Ni(NO_3)_2.6H_2O$ & $Zr(OC_3H_7)_4$ | $Y(O_2C_8H_{15})_3$ | | Propanol or Butanol | Ethanoic Acid |
| CGO (cerium gadolina) | $Ce(NO_3)_3.6H_2O$ | $Gd(NO_3)_3.6H_2O$ | | 20% $H_2O$ and 80% alcohol | HCl or $HNO_3$ |
| LSCF ($La_{1-x}Sr_xCo_{1-y}Fe_yO_3$) | $La(NO_3)_3.xH_2O$ | $Sr(NO_3)2$ | $Fe(NO_3)_3.9H_2O$ $Co(NO_3)_2.6H_2O$ | 20% $H_2O$ and 80% alcohol | HCl or $HNO_3$ |

In table 1, the composite precursors with alkoxide precursors are so-called "sol" precursors[1]. The precursor compounds are mixed in relative quantities appropriate to the desired stoichiometry of the desired film. Sufficient catalyst is added to give the coating solution the required pH.

[1]The term Sol-gel is used to described chemical processes in which polymeric gels are formed from metallo-organic starting solutions (see for example: "Sol-gel Science" by C. Jeffrey Brinker and George W. Shearer, published in 1990).

Ethanoic Acid is a preferred catalyst to provide a clear solution, an improved solution conductivity and therefore finer spray droplets. However, other acids and/or alkalis such as hydrochloric acid, ammonia, nitric acid, Lewis acid or sodium hydroxide would all be suitable catalysts.

Acid or base catalysts can influence both the hydrolysis and condensation rates and the structures of the condensed products. Acids serve to protonate negatively charged alkoxide groups, enhancing the reaction kinetics and eliminating the requirement for proton transfer within the transition site. Therefore, acid-catalysed condensation is directed preferentially towards the ends rather than the middles of chains, resulting in more extended, less highly branched polymers. Alkaline conditions produce strong nucleophiles via deprotonation of hydroxo ligands. Base-catalysed condensation (as well as hydrolysis) should be directed toward the middles rather than the ends of chains, leading to more compact, highly branched species. Hence, if porous films of good quality (e.g. adhesion and porosity) are required, alkalis are preferred as catalysts.

Similarly, various other inorganic or organic solvents can be used such as alcohol, water, or a mixture of alcohol and water could be used.

Figure 3:
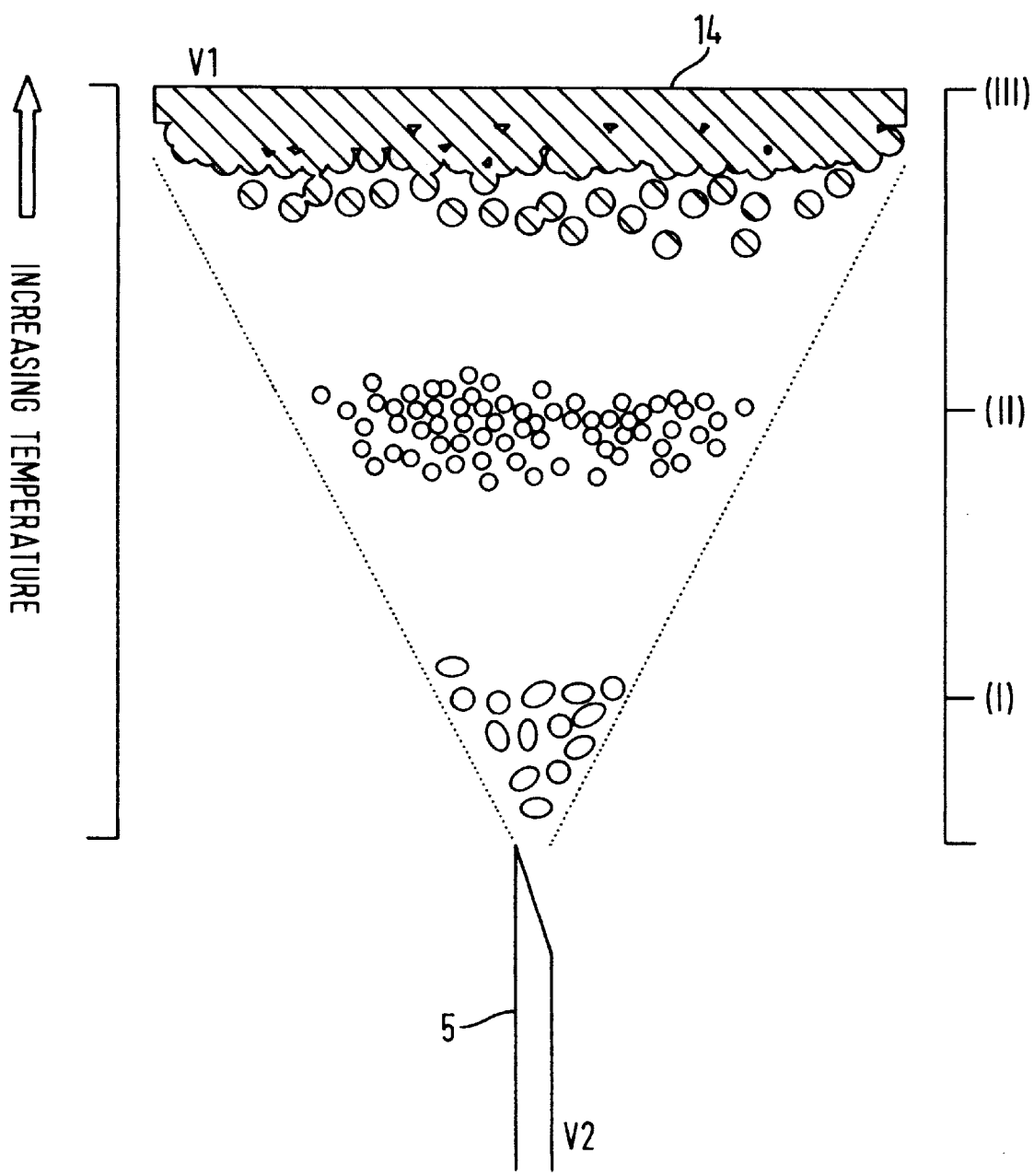
FIG. 3 schematically illustrates the principle of electrostatic spray assisted vapour deposition of a film from a coating solution using the apparatus of FIG. 1.

FIG. 3 schematically illustrates the principle of electrostatic spray assisted vapour deposition of a film from a coating solution.

The temperature preferably increases, on passing from the outlet to the substrate, from about 100° C. to between 400 and 650° C. At point (I) on FIG. 3, the coating solution forms a corona spray, the droplets of which are charged to a positive potential. As the droplets are attracted to the substrate 14 they begin to form clusters together (shown at point (II) in FIG. 3) under the influence of an increased ambient temperature. At point (III) in FIG. 3, the clusters decompose and/or react in close proximity to the substrate to form the desired ceramic film. The clusters may also react with other gaseous reactants such as oxygen. For example, the hydrolysis/condensation reaction for the production of a Sol→gel transition is as follows:

Hydrolysis:

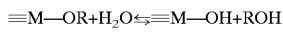

Condensation:

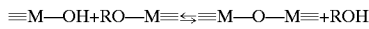

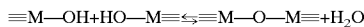

Where M is the desired metal film element (in this case of YSZ, Zirconium) and R is $C_nH_{2n+1}$, e.g. $C_4H_9$. In this method, the chemical reaction proceeds forwards (towards the right hand side of the above equations) and the reaction time decreases, with increasing temperature. Thus, the hydrolysis/condensation reaction is speeded up with increasing temperature.

The substrate and other pieces of apparatus are open to the surrounding ambient atmosphere, and so the other ambient gaseous reactants refer to any other gaseous reactants (such as oxygen) that may be found in the atmosphere. In another embodiment, the technique may performed within the confines of a container, and any desired ambient gaseous reactants (such as hydrogen sulphide, for example) may be introduced into that container. These introduced gases may react with the clusters to form particular films (such as sulphide or nitrite films, for example) on the substrate.

To summarise, during ESAVD, droplets of coating solution are charged and then transform into clusters or fine particles between the discharge outlet 5 and the substrate 14. This transformation occurs under the action of a corona field and an increasing temperature towards the substrate. These clusters and fine particles are then attracted to the substrate by virtue of the induced electric field. The temperature gradient is such that the clusters and other gaseous reactants coexist around the substrate 14. The precursor clusters undergo decomposition and/or chemical reaction with gaseous reactants just on or in very close proximity to the substrate surface. Chemical reactions involving coating precursor clusters cause the formation of the desired ceramic film—as illustrated in FIG. 3.

As this method operates on a principle whereby charged droplets from the outlet 5 are attracted towards a grounded substrate, it is particularly suitable for scanning or writing large surface areas and is not restricted to particular chamber sizes as in CVD and PVD. Growth rates achievable with this method were found to be between 0.1 and 5 microns per minute depending upon the concentration and flow rate of coating solution. Higher growth rates are possible by further altering the deposition conditions.

The achievable microstructure, grain size, composition, surface morphology and thickness of ceramic films are strongly dependant on the process conditions. The grain size in the deposited film is mainly determined by the droplet size, and the flow rate, viscosity and concentration of coating solution and substrate temperature. For example, the grain size of ceramic films increases and uniformity of the grain distribution decreases as the droplet sizes, flow rates, concentration, substrate temperature and viscosity of coating solution increase. Similarly, droplet sizes are mainly determined by the corona field intensity and coating liquid conductivity. The mean droplet size decreases with increasing coating liquid conductivity. Thus, films with nanosize grained microstructure can be deposited with the ESAVD technique.

The crystal phase structures of the deposited ceramic films are mainly determined by the temperature of the substrate 14. Ceramic films formed at lower substrate temperatures, have an amorphous or nanocrystalline crystal phase. These films may then be treated by an additional sintering process, to transform the crystal structure from an amorphous or nanocrystalline structure to the desired ceramic phase. A higher substrate temperature during deposition results in an increase in crystallinity of the ceramic film deposited thereupon.

Other films, such as simple oxide films, multicomponent oxide films (e.g. PZT (Lead Zirconate Titanate—$Pb(Zr_xTi_{1-x})O_3$), $PbTiO_3$, $BaTiO_3$, Indium Tin Oxide or $La(Sr)MnO_3$) or doped films (e.g. YSZ (Yttria Stabilised Zirconia—$(ZrO_2)_{0.92}(Y_2O_3)_{0.08}$) or Ni-YSZ) etc. structural and/or functional films such as electroceramic films, nanostructured films, and/or of course films other than ceramics, may be produced with this technique.

Referring back to FIG. 1, because the temperature gradient generated by the projections of the substrate holder 4 towards the outlet 5 is not necessarily constant in front of the substrate 14 in the plane of the substrate, the uniformity of coating thickness can be improved by rotating and/or translating (in general, moving) the outlet and/or the substrate holder during deposition to vary the relative positions of the outlet and the substrate with time. If rotary motion is used, this could involve, for example, rotating the substrate (which might be three-dimensional) about an axis passing through the substrate, or possibly rotating the outlet (or outlets, if more than one is used) about an axis which is not coaxial with the outlet's axis (i.e. "circling" the outlet around).

In another feature, the polarity of the electric field applied between the outlet and the substrate holder can be reversed from time to time during the deposition process. This can be beneficial to avoid the accumulation of charges (which can counteract the effect of the applied field), thus allowing thicker coatings to be produced.

"Graded" coatings can be produced by varying the concentration and/or composition of the precursor solution during deposition. Simply, this can be achieved by depositing the contents of a first container (bottle) of precursor solution, and then switching to another container and so on.

Similarly, it has been found that films may be produced of a thickness varying from a nanometer to approximately 100 micrometers in thickness (or much thicker). The coatings can be used in microscale circuitry or for much bulkier items such as turbine blades for jet engines, by scaling up the apparatus (the apparatus of FIGS. 1 and 4 as shown has a substrate diameter of about 20 mm).

Single crystal substrates can be used to obtain oriented or epitaxial films. A range of microstructures including epitaxial, columnar and equiaxial growth are possible by varying the processing conditions.

The substrates may be conductive (e.g. metal) or non-conductive (e.g. glass, polymer or ceramic).

Figure 4:
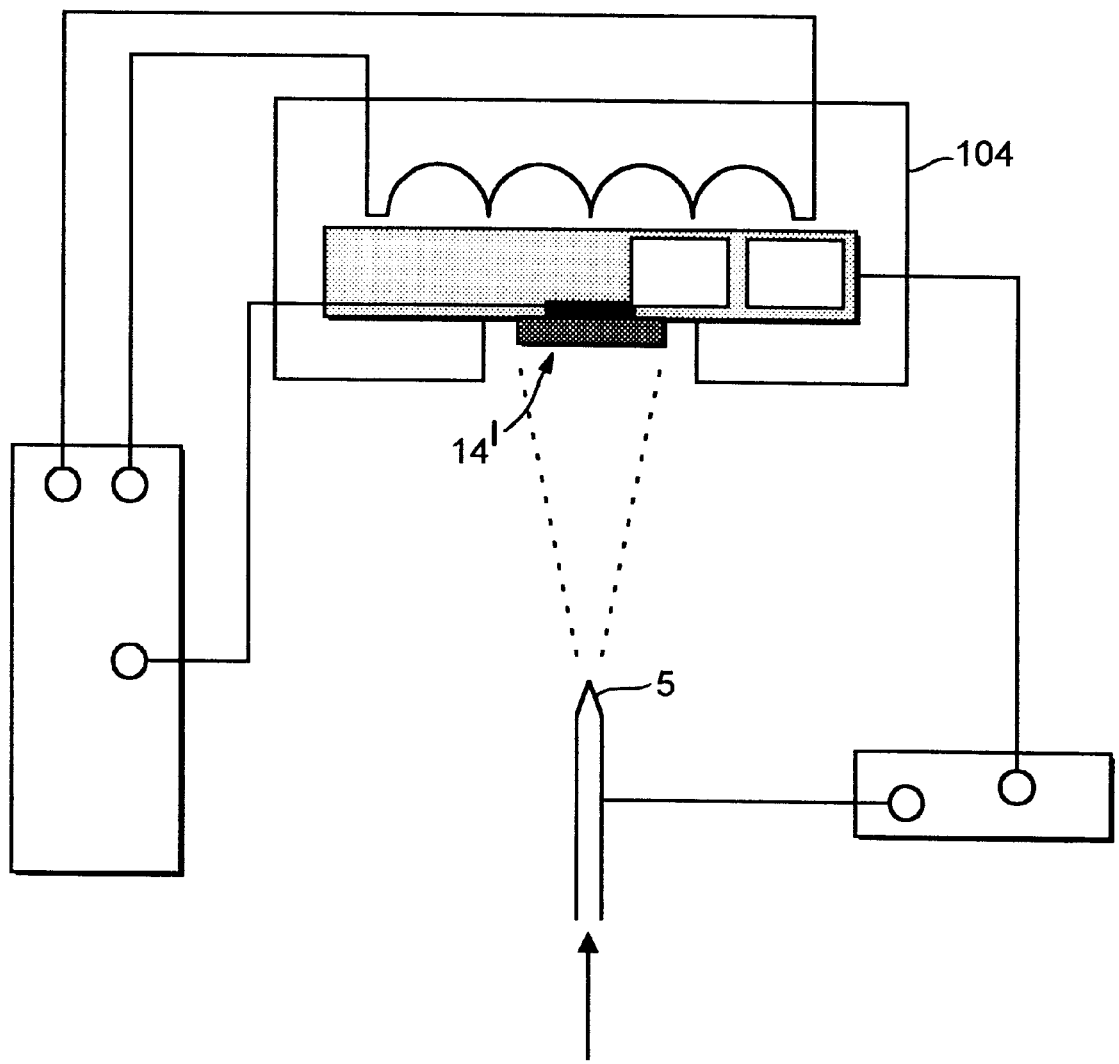
FIG. 4 schematically illustrates another embodiment of apparatus for use in electrostatic spray assisted vapour deposition.

Another embodiment of an electrostatic spray assisted vapour deposition (ESAVD) apparatus is schematically illustrated in FIG. 4.

The apparatus of FIG. 4 is similar to that of FIG. 1, except that a shaped substrate holder 104 projects towards the outlet 5 at either side of the substrate 14'. The substrate holder 104 is heated as before, and this heating serves to set up a temperature gradient whereby the ambient temperature increases as the substrate 14' is approached from the direction of the outlet 5. The arrangement of FIG. 1 also provided an increase in temperature approaching the substrate 14' from the direction of the outlet 5, but the arrangement of FIG. 4, with the projecting parts of the substrate holder 104, provides a more gradual temperature gradient. This increased temperature and more gradual temperature gradient facilitates solvent evaporates and decomposition of the coating solution near the vicinity of the substrate that enables deposition of the film.

The use of the apparatus of FIG. 4 (or indeed, FIG. 1) to produce PVDF polymer coatings on the substrate will now be described.

The improvement of the performance of polymer films, and the ability to fabricate specific bulk polymer with tailored surface compositions for particular applications have become important considerations. The need for designing polymer with well-controlled chemical compositions at the surface arises from the fact that interfacial phenomena define properties that are crucial to the service performance of a particular device. Examples of applications where polymer surface properties are important include wetting, printing, biomedical and electronic devices. In all these cases, molecules from the "environment" approach the polymer surface and experience interfacial forces due to electrostatic and positive/or negative charged cloud interactions. It thus becomes possible, in principle, to design guided approaches towards device optimization by controlling polymer film growth in order to alter or control interfacial interactions of polymers by the provision of appropriate chemical structure in the surface layers.

Surface modification techniques have been used widely in polymer industry. The techniques of flame treatment, acid etching, and corona discharge treatment after the fabrication of the bulk polymer materials have been used extensively in industrial applications, produce a variety of new polar surface. This is quite acceptable in wetting and printing applications, but for applications of polymers in electronic and biomedical devices, the presence of a polar surface is not sufficient. The alignment of polar groups in polymer films along preferred orientation need to be considered as well. Plasma surface treatment techniques have the advantage for the surface modification of commodity polymer substrates, but the penetration depth of the treatment is very low at a reaction level for useful surface modification. Meanwhile, the equipment of plasma technique is very expensive and needs highly skilled technicians.

A typical example for the polymer depositions is to fabricate the piezoelectric and pyroelectric polyvinylidene fluoride (PVDF) film. PVDF film has a large dielectric constant, due to the large dipole moment of $CF_2$, and is one of the most polar dielectric polymers. Its advantages over ceramic materials include light weight, flexibility, toughness, ease of fabrication and low permittivity. The conventional fabrication of PVDF films for electronic application normally involves two production steps. Firstly, PVDF bulk films are produced by a conventional method such as cast, hot pressing, dipping and spin coating of PVDF solution. Then, PVDF bulk films are treated by the modification techniques such as high thermal high voltage poling, corona poling, stretching and electron beam discharge etc. However, the deposited PVDF films cannot be stretched, it is difficult to prepare $\beta$-phase crystal film by this method. On the other hand, the breakdown of thin films occurs easily under a high electric field. As a result, it is not easy to pole thin PVDF films. In the present technique, the film production and surface modification poling of polymer PVDF films can be achieved in a single production step.

Therefore, in this application, the outlet's inner diameter preferably reduces towards the outlet's tip from about 1 mm to about 0.1 mm. This relatively large initial inner diameter ensures that the likelihood of clogging problems with high viscosity solutions (such as PVDF) in the outlet 5 is significantly reduced.

A substantially constant flow of PVDF coating liquid to the outlet 5 is maintained by use of a syringe or pneumatic pump (not shown). Preferably, the solution flow is in the range of 0.4–10 ml/h.

In this way, the electrostatic field set up between the charged outlet 5 and substrate holder 104 serves to guide charged coating solution droplets to the substrate 14'. As described earlier, droplets of the coating solution are provided with a negative charge by way of the high voltage DC source 1. These negatively charged droplets are thus attracted onto the substrate and in moving towards the substrate pass through a region of increasing temperature gradient. The temperature gradient ensures that the solvent evaporates before the PVDF precursor droplets reach the substrate 14' and the chemical reaction occurs just on or in very close vicinity of the substrate surface to form a PVDF crystal phase film coating.

After the PVDF film coating has been applied, the syringe pump can be turned off and heating can be stopped. The PVDF film coated substrate is then cooled down up to room temperature, with the electric field maintained during this cooling process.

Figure 5:
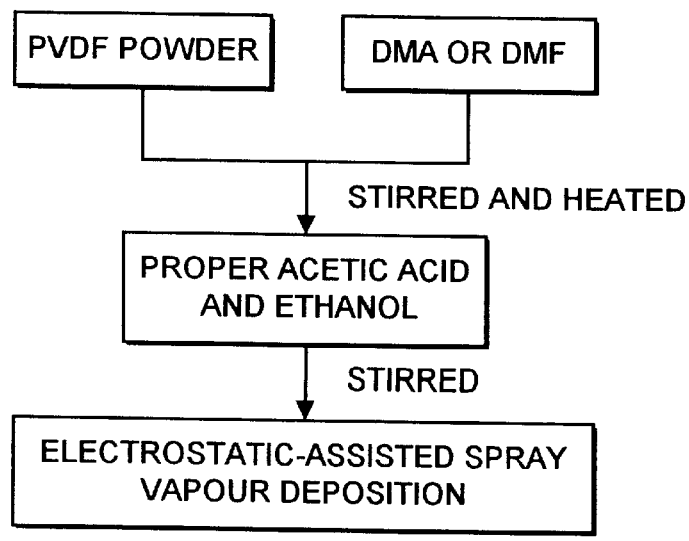
FIG. 5 is a flow chart illustrating steps in a polymer deposition process.

FIG. 5 is a flow chart illustrating steps in a polymer deposition process.

Referring to FIG. 5, a precursor solution used to deposit the films of PVDF comprises a mixture of poly vinylidene fluoride (PVDF) powder and solvent N,N,-Dimethylformamide (DMF) or N,N,-Dimethylacetamide (DMA). As a first step, PVDF powders are dissolved in DMA or DMF solvent. This solution is stirred and heated at 60° C. for thirty minutes. A clear solution with 0.01 to 0.1M concentration in PVDF is yielded. Then, acetic acid CH₃COOH is added into the solution as catalyst according to pH 2 to 5 and conductivity range greater than or equal to 2.0 μs at room temperature. After thirty minutes stirring, a clear precursor solution for PVDF film coating is obtained.

Although there is no complete agreement among investigators regarding the mechanism responsible for piezoelectricity and pyroelectricity in PVDF, there is nearly unanimous agreement that a polar crystal form is required for optimum activity. One of the complicating factors about PVDF is that it can exist in four different crystal forms. The crystal phase in which the chain conformation is trans-gauche-trans-gauche is called α-phase. The chains are then packed in a monoclinic unit cell which is non-polar.

A variety of techniques have been employed to form PVDF films into a second crystal phase called β-phase in which the chain conformation is essentially all trans and the chains crystallized in an orthorhombic unit cell with a net dipole moment.

It is thus known that there are at least two stable crystal forms of PVDF, a T-G-T-G non-polar form (α-phase) and a planar zig-zag polar form (β-phase). One can obtain an oriented β-form from the α-form in PVDF films by mechanical stretching or rolling, corona discharge, and high temperature high voltage poling. A number of researchers have shown that the β-form is very important in obtaining good piezoelectricity and pyroelectricity in PVDF films.

Since the β-form crystal exhibits a net dipole moment, the present process uses the inventors' observation that molecular dipoles on chains within the crystalline regions of the polymer become aligned with the applied electric field during the poling process and are then relatively stable in such an orientation in the absence of the piezo- and pyro electric response. Only the crystalline regions of the polymer would become permanently aligned and then only that component of the chain axis which lies in the plane of the film would be expected to contribute to the polarisation.

For identifying the influence of corona field in trials of this process, in fact two experimental processes were compared. In the first case, the corona field was turned off while samples were cooled down to room temperature after deposition (process I). In the second case, the corona field was maintained while samples were cooled down to room temperature after deposition (process II), to maintain the dipole orientation of the deposited material in a required orientation until the material solidified.

Figure 6A:
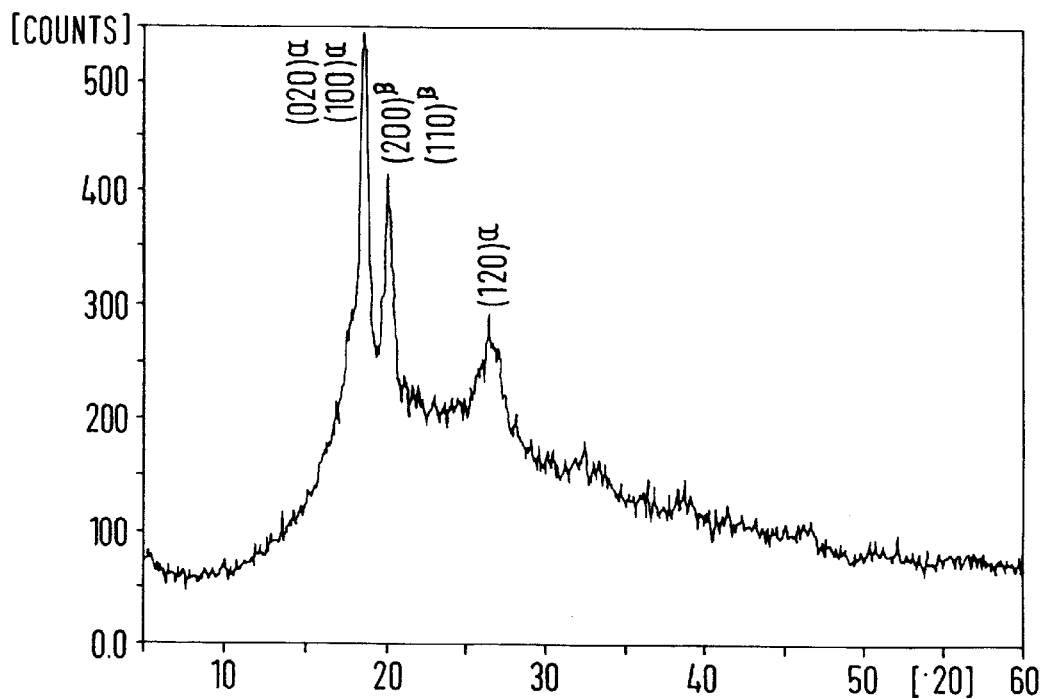
FIGS. 6a and 6b illustrate X-ray diffraction patterns for polymer films produced by two process variants.
Figure 6B:
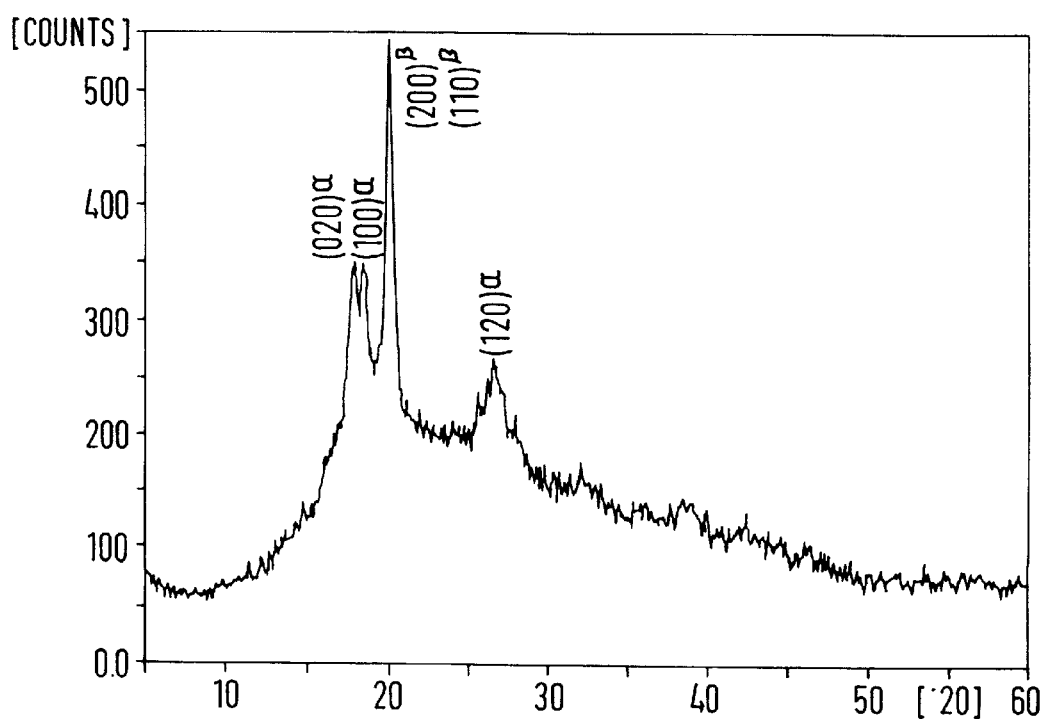
Figure 7A:
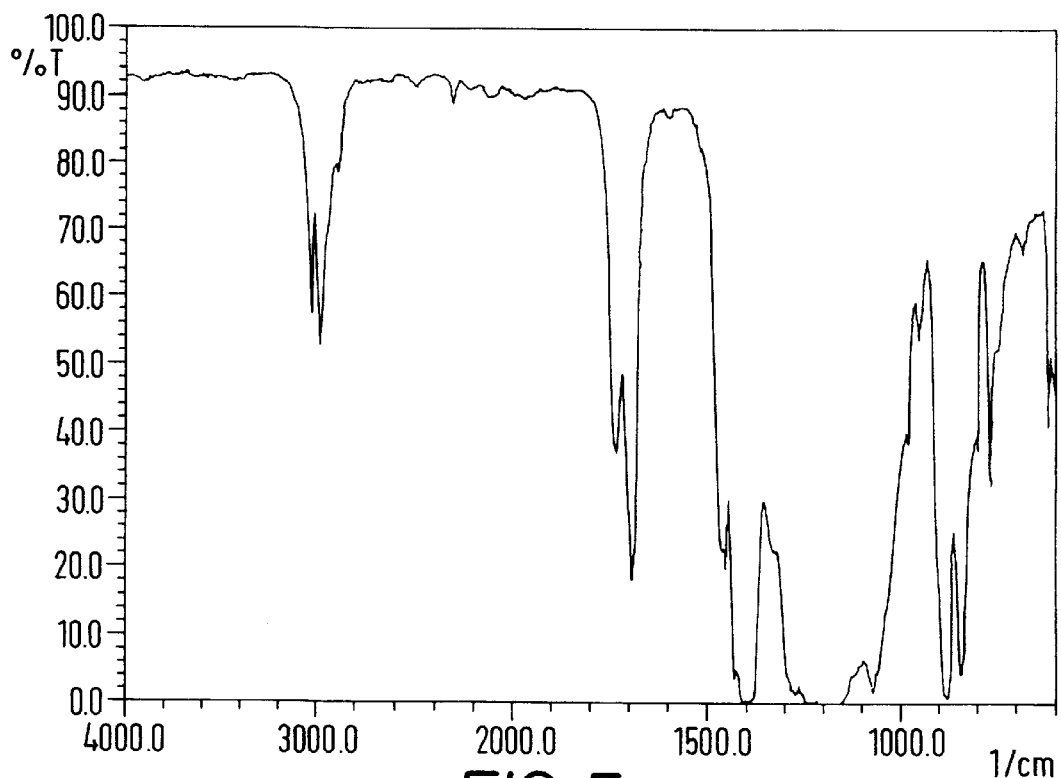
FIGS. 7a and 7b illustrate transmittance infra-red spectra for polymer films produced by the two process variants.
Figure 7B:
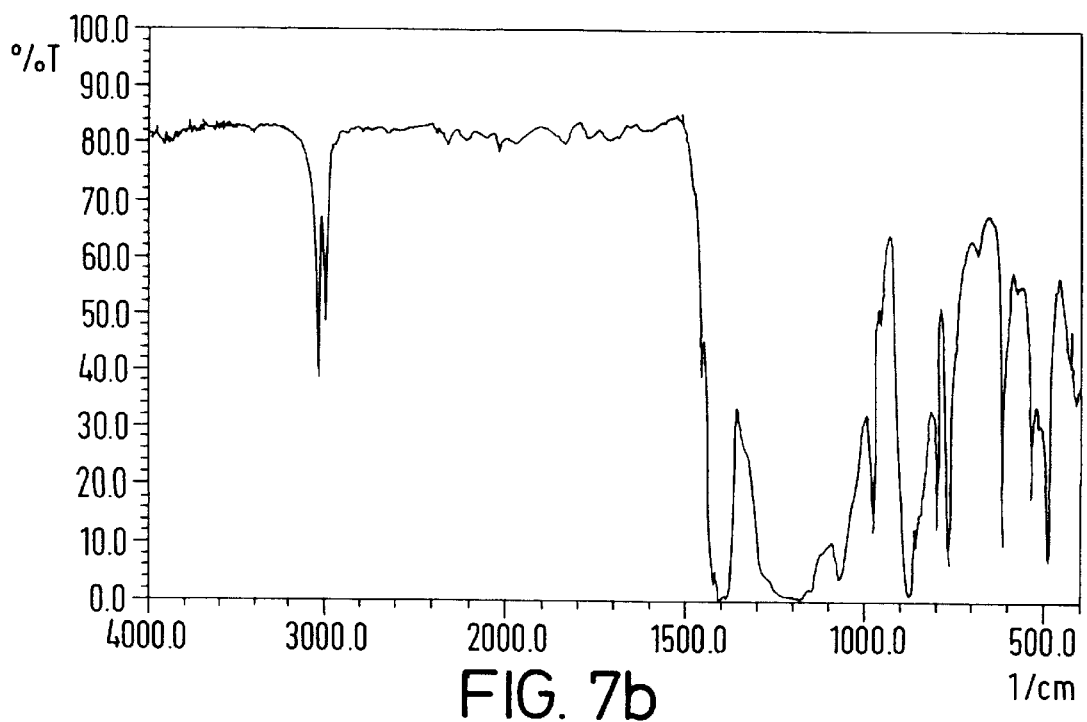
Figure 8A:
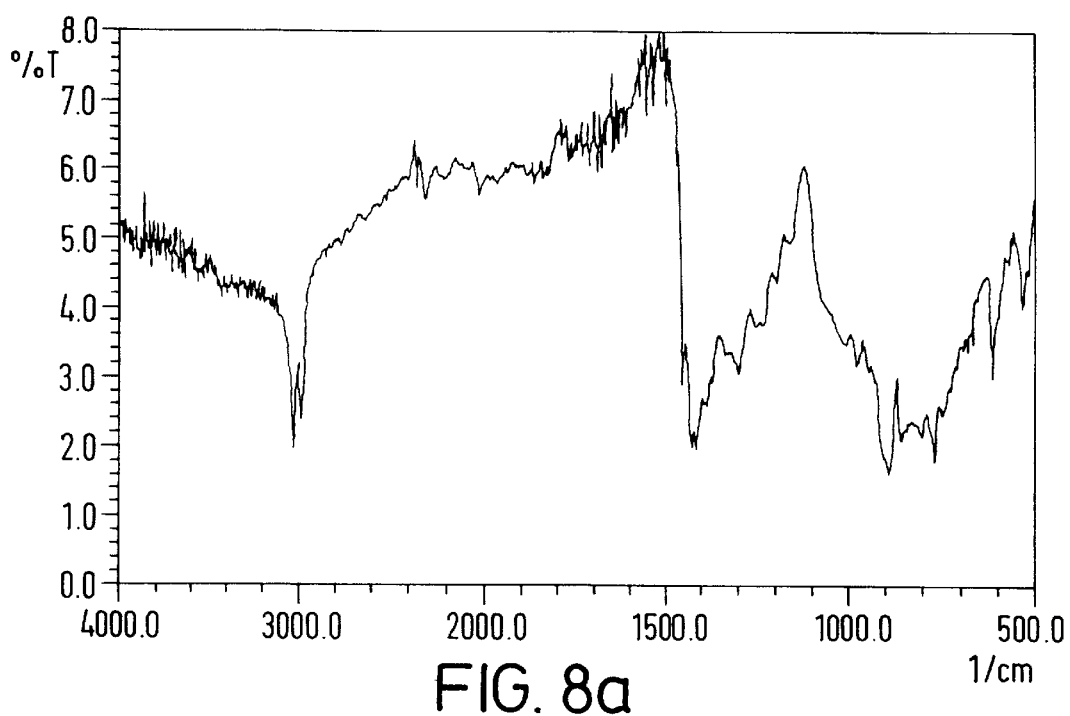
FIGS. 8a and 8b illustrate surface reflectance infra-red spectra for polymer films produced by the two process variants.
Figure 8B:
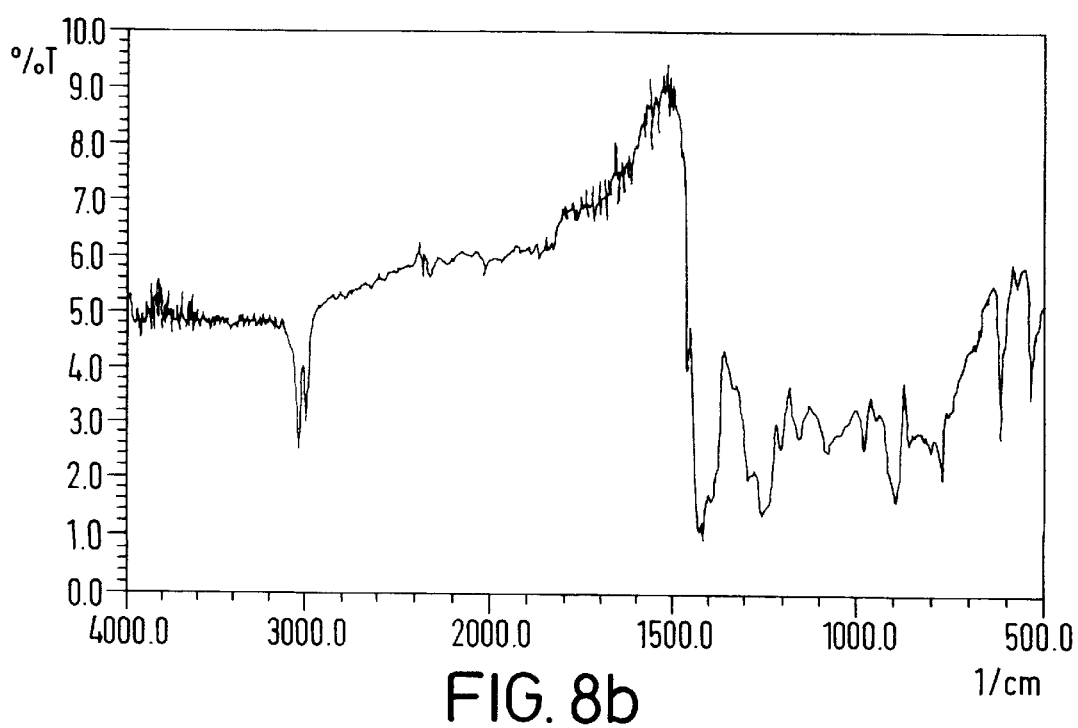

X-ray diffraction patterns of the PVDF film produced under process I and process II are shown in FIGS. 6a and 6b respectively. The diffraction peak observed at 2θ≈20.8° is assigned to unresolved (110) and (200) diffraction of β-phase in PVDF. α-phase in PVDF shows diffraction peaks 2θ≈18° assigned to (100), (020) and (021) respectively. The comparison of process I with process II shows that the intensity of main peak at about 20.8° increases under corona field. It indicates that some parts of α-phase have transformed into β-phase in PVDF. This result was confirmed by respective infra-red (IR) spectra, as shown in FIGS. 7a (Process I) and 7b (Process II) for transmission spectra, and FIGS. 8a (Process I) and 8b (Process II) for reflectance spectra.

Many journal papers have reported on the crystal forms of PVDF from IR spectra. The α- and β-phase crystal forms have many common absorption band characteristics (such as CH, CH₂, CF, CF₂, and C—C etc.) as reported in the literature. It is known that the crystal forms can be identified by the characteristic absorption bands of β-phase at about 510 and about 1280 cm⁻¹, and that of α-phase at about 530, about 610 and about 795 cm⁻¹.

From the results of IR analysis between process I and II, it is clear that the contents of β-phase is higher in the PVDF film produced using process II, but a certain amount of α-phase may still exist under process II. It indicates that PVDF films prepared by process II consist mainly of the β crystal phase with some α-phase. Meanwhile, it is also found that corona field strongly influenced the surface structure of PVDF film. From the spectra, it is observed that since the absorption peak at about 1280 cm⁻¹ in process II is assigned to the CF₂ symmetric stretching vibration of β crystal phase, and is stronger than that in process I, the results of the IR spectra suggest that β-form crystal is oriented and the CF₂ dipoles are aligned along the applied corona field.

There have been many investigations of α-phase and β-phase crystal in PVDF film. It is well known that the α-phase crystal is more stable than the β-phase crystal. The reason why the β-phase crystal was formed in spite of its instability was not clear. In the present case of ESAVD, it is proposed that the stability and the mechanism of β-phase crystal formation is as follows. Because β-phase crystal is the polar crystal, β-phase is stabilized and formed in preference to α-phase when the corona field exist during the deposition of PVDF film. Consequently, the content of β-phase increases with increasing the energy supplied to the substrate by the corona discharge. Under the conditions shown in the experimental section, the charged droplets of the PVDF solution were attracted onto the substrate and the PVDF film was formed by evaporation of the solvent and decomposition of precursor solution during substrate temperature field. PVDF polymer seems to have enough mobility to change the conformation aligned along the applied field direction under the existence of the corona field during evaporation of the solvent. But if the corona field does not exist after deposition (as process I), a certain amount of energy is obtained to rearrange the PVDF molecules because the substrate temperature is high enough near/or over PVDF melting point 170° C. In contrast, when the corona field exists during cooling down of the PVDF film to room temperature, the polar groups in PVDF film are "cooled" along the applied corona field direction.

Figure 9B:
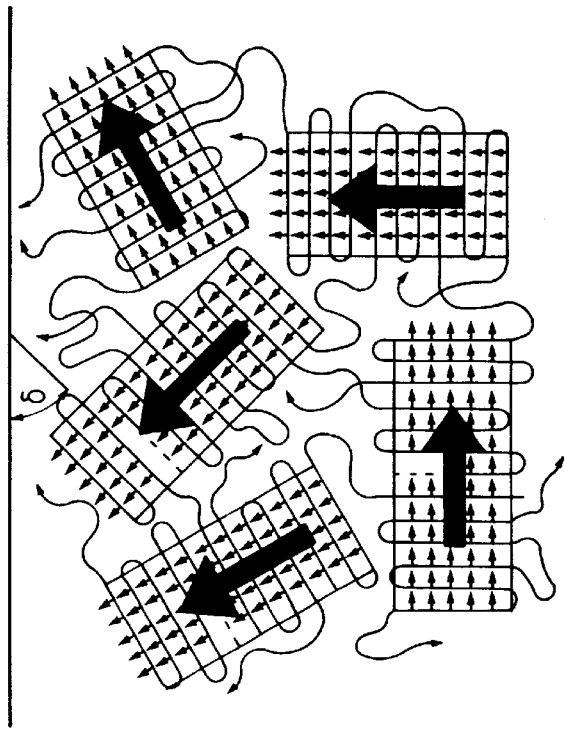
FIGS. 9a and 9b are schematic diagrams showing dipole orientation in polymer films produced by the two process variants.
Figure 9A:
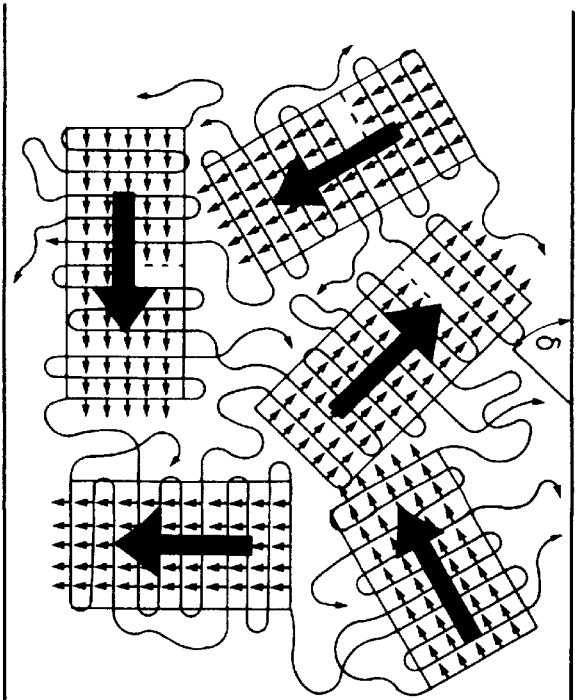

FIGS. 9a and 9b are schematic diagrams showing dipole orientation in polymer films produced by the two process variants, process I and process II. These illustrate that under process II a PVDF film with oriented β-phase crystal is obtained, which is very important for getting good piezoelectricity and pyroelectricity in PVDF film.

The present studies thus show that the oriented thin PVDF film can be prepared directly onto a substrate in a single step by a novel ESAVD technique. The corona field is maintained during substrate cooling to form oriented polar polymer film PVDF, but other forms of PVDF can be produced without maintaining the field. The corona field helps to transport the charge droplets of PVDF solution onto the substrate to form PVDF thin film, and forces the polar group in PVDF thin film to align along the corona field.

In conclusion, the utilization of corona field in the vapour deposition process is effective in controlling crystal forms and their orientation, to form polar polymer films.

The present results also clearly revealed the potential of this technique to deposit polymer thin film of good quality with very simple equipment. This technique can be used in the fabrication of a wide range of polymer films, including polar and conductive polymer/or co-polymer coatings, such as PVDF, PTFE, polyanilines, and polypyrrole etc.

Figure 10:
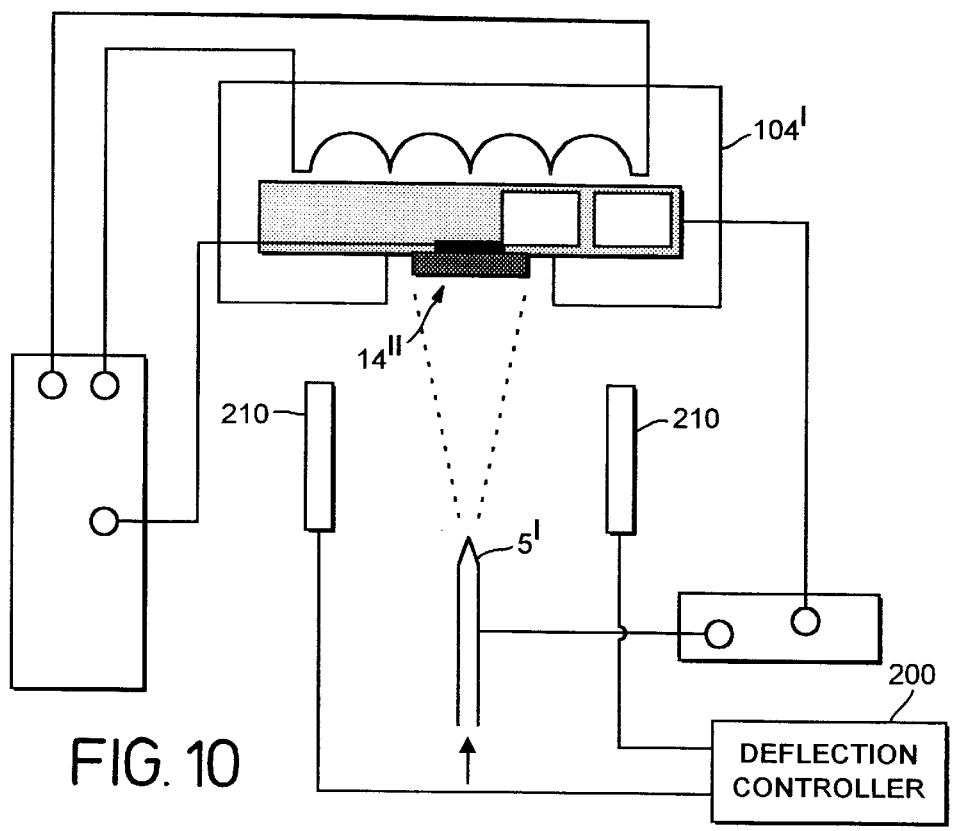
FIG. 10 schematically illustrates a third embodiment of apparatus for material deposition.
Figure 11:
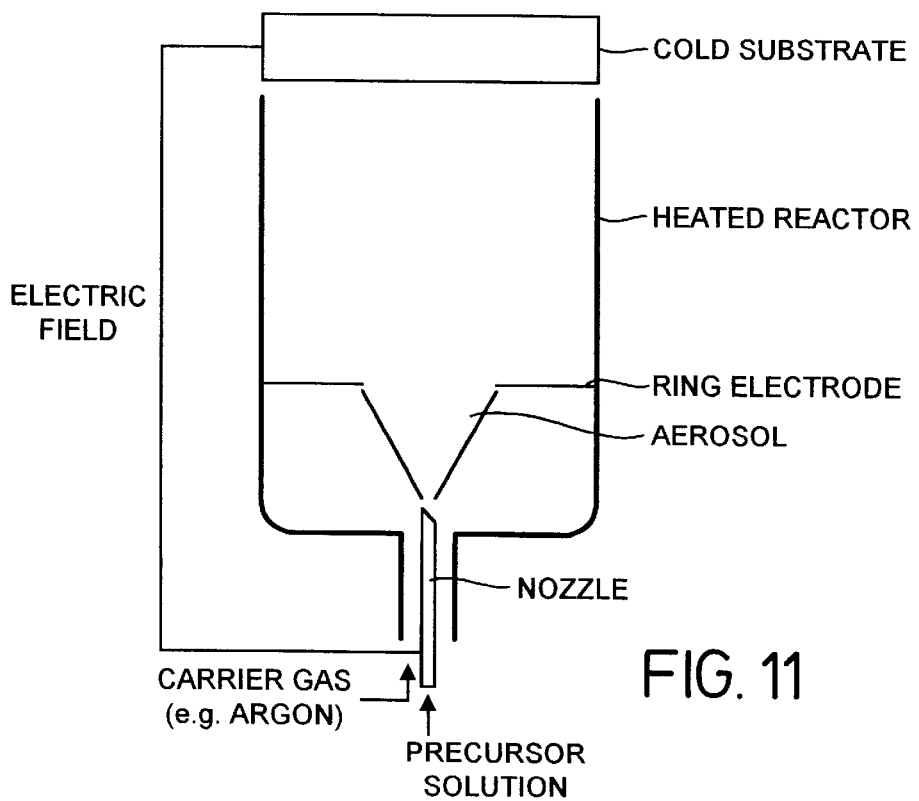
FIG. 11 illustrates a fourth embodiment, used for powder deposition.
Figure 12:
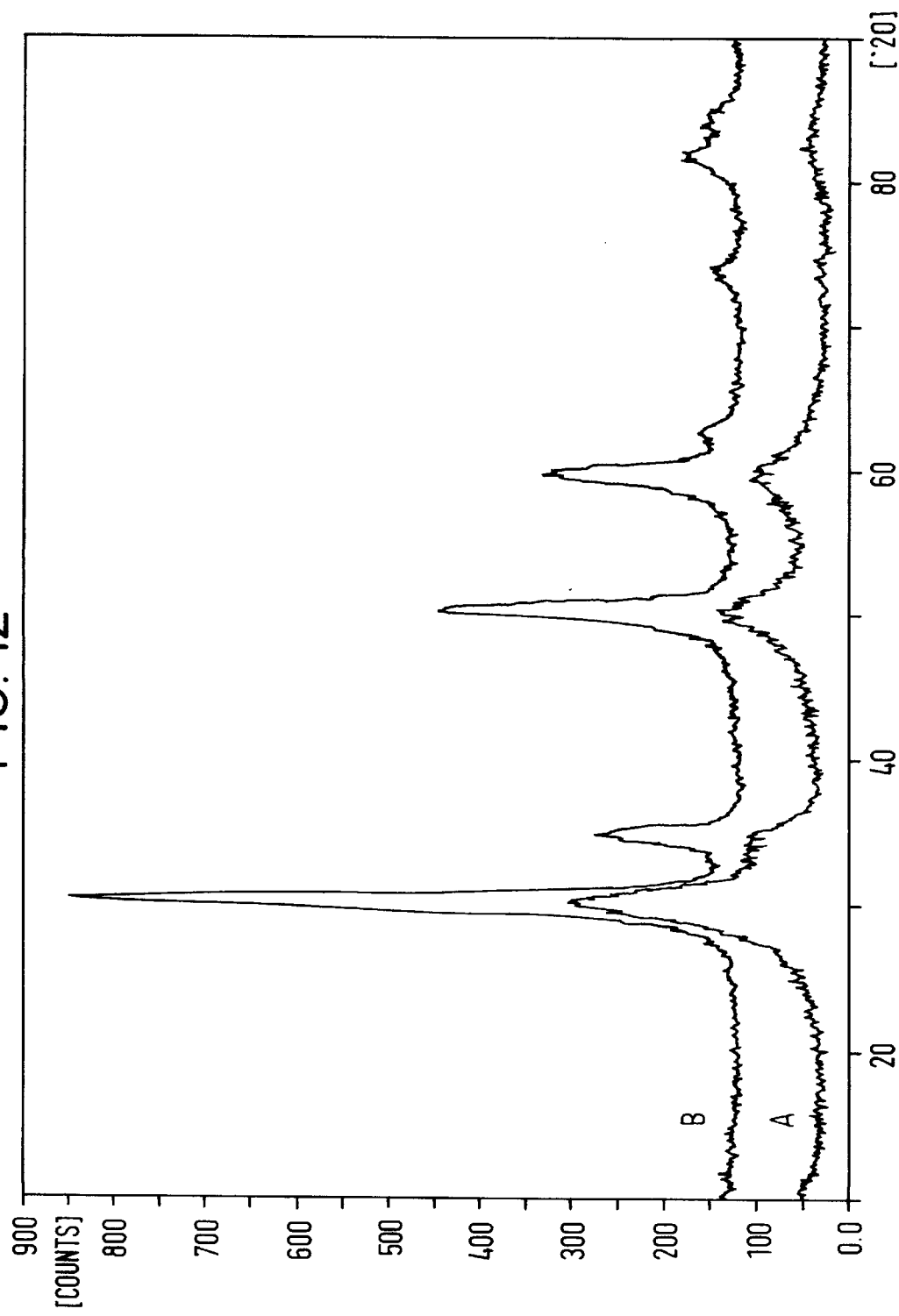
FIG. 12 (curves A and B) show x-ray diffraction patterns for the nanopowders produced at 500° C. and 800° C. respectively.
Figure 13:
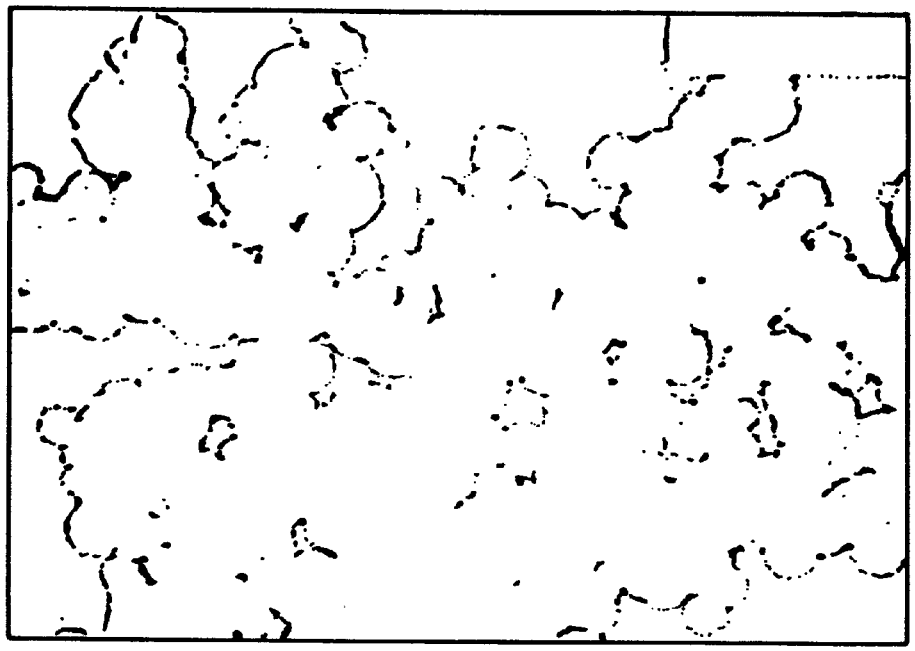
FIGS. 13 and 14 show the microstructures of YSZ nanopowders at different reaction temperatures.
Figure 14:

FIG. 10 illustrates a third embodiment of a deposition apparatus. In many respects, the apparatus of FIG. 10 is similar to that of FIG. 4, but for the addition of deflectors 210 under the control of a deflection controller 200 (components analogous to those in FIGS. 1 and 4 are similarly numbered in FIG. 10, with the use in FIG. 10 of a prime (') or double prime (") after the number).

The deflectors are used to deflect the spray of electrically charged droplets emerging from the outlet. This can steer or concentrate the spray on particular desired areas of the substrate, or move the spray distribution around to help to compensate for an uneven temperature gradient near the substrate. The deflectors can be electrostatic plates, in which case the deflection controller supplies a high voltage between the plates to deflect the electrically charged spray emerging from the outlet, and/or magnetic deflectors (eg a yoke coil or other winding), in which case the deflection controller supplies a current to coils in the deflectors to generate a magnetic field to deflect the charged spray.

In other embodiments, the substrate could be heated to a temperature just below the required for film deposition (e.g. 50° C. below that required for film deposition). If a laser beam is then directed onto the substrate by a suitable beam-steering mechanism and used to heat very localised areas of the substrate while the solution is being sprayed from the outlet, deposition will occur selectively at those areas of the substrate.

In further alternative embodiments, masking can be used to mask off certain areas of the substrate to give control over where the film is deposited.

FIGS. 11 to 14 relate to the use of these techniques to generate powders, rather than films or coatings. The example to be described is that of YSZ powders, but many other materials (particularly the materials described above with reference to the film or coating techniques) could be used.

The differentiation between film (coating) production and powder production, using basically the same apparatus, is mainly one of temperature (although other operational parameters can be varied). If the ambient temperature between the outlet and the substrate is increased then the droplets of coating solution will tend to form powder particles before hitting the substrate. This effect can be exaggerated by slowing down the flight of the droplets—e.g. by changing the flow rate or the electric field—to give more time for the powder to form. Alternatively, if a cold substrate is used, then the droplets will condense into powder particles on hitting the substrate.

FIG. 11 illustrates a suitable apparatus for manufacturing the powdered YSZ. The apparatus comprises a tubular, up-flow reactor equipped with an external resistive heater. YSZ sol precursor is delivered at an appropriate flow into a stainless steel capillary outlet (100 $\mu$m inside diameter, 650 $\mu$m outside diameter) which is maintained at a dc voltage of 10–30 kV (positive polarity). The capillary electrode is placed 15–30 mm from a ring electrode maintained at 1 kV dc voltage. The function of the ring electrode is to focus the spray aerosol into the reactor chamber and select the appropriate nanosized particles to reach the substrate. The high local electrostatic field at the capillary tip causes an emission of charged aerosol from the highly deformed liquid interface. A stream of Argon gas from a coaxial glass capillary (800 $\mu$m inside diameter) carries the spray charged aerosol through the ring electrode into the reaction zone of the reactor, finally to arrive at the cold substrate (having a negative polarity).

The YSZ sol precursor with monodispersed nanosize particles is synthesized as follows. First, $Y(NO_3)_3.6H_2O$ is dissolved in 2-propanol while stirring for about 15 min at room temperature yielding a clear solution. Zirconium tetra n-butoxide, $Zr(OC_3H_9)_4$ is added into the previous solution according to the stoichiometry of a desired final composition of $(ZrO_2)_{0.92}(Y_2O_3)_{0.08}$. The final sol precursor concentration and pH are preferably 0.05M and 3–5 respectively. The hydrolysis and condensation can be carried out at room temperature under stirring.

The YSZ nanoparticles produced by a prototype of this technique were analysed using x-ray diffraction and transmission electron microscopy (TEM).

The quality of the YSZ nanopowders depends strongly on the process conditions. Below a reaction temperature of 450° C., all samples appeared to be amorphous from the x-ray diffraction traces. FIG. 12 (curves A and B) shows x-ray diffraction patterns for the nano-powders produced at 500° C. and 800° C. respectively. The x-ray diffraction patterns show that fully stabilized cubic zirconia (YSZ) nanopowders are directly formed. The presence of monoclinic or free $Y_2O_3$ phases was not detected in YSZ powders produced at about 500° C. No other new phases were observed. It indicates that $Y_2O_3$ has been perfectly dissolved into the ZrO2 lattice to form a solid solution.

FIGS. 13 and 14 show the microstructures of YSZ nanopowders at different reaction temperatures. In the nanopowder formation process, the YSZ aerosol is produced by electrostatic assisted spray, and delivered into the reaction zone in a CVD reactor chamber, with the fine droplets of aerosol being converted into dry gel and pyrolyzing to form the nanopowders on the cold substrate under an appropriate low temperature. TEM micrographs reveal that the distribution of YSZ nanoparticles is uniform and the average size of YSZ powders deposited at 500° C. is 10–20 nm (FIG. 13). Under the high reaction temperature (e.g. 800° C.), particle-cluster aggregation occurs. TEM micrographs reveal that the distribution of YSZ nanoparticles is not uniform and the YSZ particle size is in the range of 30–80 nm at high temperatures (FIG. 14).

What is claimed is:

1. A method of depositing a material onto a substrate, the method comprising the steps of:

pressure feeding a material solution comprising one or more precursor compounds, a solvent and a pH-modifying catalyst from a material solution supply to an outlet;

generating an electric field between the outlet and a substrate to provide a corona spray of droplets of the material solution and electrostatically guide the droplets from the outlet towards a surface of the substrate; and providing a decreasing temperature gradient from the surface of the substrate to the outlet, which temperature gradient is such that evaporation of the solvent from, and decomposition of, the droplets occurs as the droplets approach the surface of the substrate.

2. A method according to claim 1, wherein the step of generating an electric field comprises the step of applying a voltage to the outlet such that droplets of the material solution emerging from the outlet are charged and attracted to the substrate by virtue of the electric field.

3. A method according to claim 1, comprising the step of relatively rotating and/or translating the outlet and the substrate during the method.

4. A method according to claim 1, comprising the step of varying the material solution composition and/or concentration during the method.

5. A method according to claim 1, comprising the step of reversing the polarity of the electric field between the outlet and the substrate at intervals during the method.

6. A method according to claim 1, comprising the step of locally heating areas of the substrate to enhance material deposition at the heated areas.

7. A method according to claim 1, comprising the step of electrostatically and/or magnetically steering the stream of droplets in transit from the outlet to the substrate.

8. A method according to claim 1, wherein the material is deposited as a film.

9. A method according to claim 8, wherein the film is a multicomponent oxide film, a simple oxide film or a doped film.

10. A method according to claim 8, wherein the film is one or more of a structural film, a functional film, and an electroceramic film.

11. A method according to claim 1, in which the material is deposited as a powder.

12. A method according to claim 1, in which the material solution is a polymer solution.

13. A method according to claim 12, comprising the step of maintaining the applied electric field for at least part of the time during which the material deposited on the substrate is allowed to cool.

14. A method according to claim 1, wherein the catalyst is an acid, added in sufficient quantity to give a material solution pH of between 2 and 5.

15. A method according to claim 14, wherein the catalyst is selected from the group consisting of ethanoic acid and hydrochloric acid.

16. A method according to claim 1, wherein the catalyst is an alkali, added in sufficient quantity to give a material solution pH of between 9 and 12.

17. A method according to claim 16, wherein the catalyst is $NH_3$.

18. A method according to claim 1, wherein the droplets of material solution are charged to approximately 5 to 30 kV with respect to the substrate.

19. A method according to any one of claims 1 to 18, wherein the temperature decreases to a temperature in the approximate range from about 650 to about 100 degrees Celsius.

20. The method according to any one of claim 1–18, wherein the temperature decreases to a temperature in the approximate range from about 400 to about 100 degrees Celsius.

21. A method according to claim 1, wherein the method is performed within the confines of a container and gaseous reactants are supplied to the container, enable deposition of a film.

22. A method according to claim 1, wherein the material is Lead Zirconate Titanate (PZT), and the material solution is manufactured by the steps of:
    (a) mixing $CH_3OCH_2CH_2OH$ (solvent) with a first precursor compound $Pb(CH_3CO_2)_2$ and $Zr(OC_3H_7)_4$ and a second precursor compound $Ti(OC_3H_7)_4$, and
    (b) adding a catalyst to the mixture to provide a material solution of a required pH.

23. A method according to claim 1, wherein the material is $PbTiO_3$, and the material solution is manufactured by the steps of:
    (a) mixing $CH_3OCH_2CH_2OH$ (solvent) with a first precursor compound $Pb(CH_3CO_2)_2$ and a second precursor compound $Ti(OC_3H_7)_4$, and
    (b) adding a catalyst to the mixture to provide a material solution of a required pH.

24. A method according to claim 1, wherein the material is $BaTiO_3$, and the material solution is manufactured by the steps of:
    (a) mixing $CH_3OCH_2CH_2OH$ (solvent) with a first precursor compound $Ba(CH_3CO_2)_2$ and a second precursor compound $Ti(OC_3H_7)_4$, and
    (b) adding a catalyst to the mixture to provide a material solution of a required pH.

25. A method according to claim 1, wherein the material is $SnO_2$—$In_2O_3$, and the material solution is manufactured by the steps of:
    (a) mixing ethanol (solvent) with a first precursor compound $In(NO_3)_3.xH_2O$ and a second precursor compound $SnCl_2$, and
    (b) adding a catalyst to the mixture to provide a material solution of a required pH.

26. A method according to claim 1, wherein the material is $La(Sr)MnO_3$, and the material solution is manufactured by the steps of:
    (a) mixing about 20% $H_2O$ and about 80% ethanol (solvent) with a first precursor compound $La(NO_3)_3.xH_2O$ and $Mn(NO_3).6H_2O$ and a second precursor compound $SrNO_3$, and
    (b) adding a catalyst to the mixture to provide a material solution of a required pH.

27. A method according to claim 1, wherein the material is Yttria Stabilised Zirconia (YSZ), and the material solution is manufactured by the steps of:
    (a) mixing propanol or butanol (solvent) with a first precursor compound $Y(O_2C_8H_{15})_3$ and a second precursor compound $Zr(OC_4H_9)_4$, and
    (b) adding a catalyst to the mixture to provide a material solution of a required pH.

28. A method according to claim 1, wherein the material is Yttria Stabilised Zirconia (YSZ), and the material solution is manufactured by the steps of:
    (a) mixing propanol or butanol (solvent) with a first precursor compound $Y(O_2C_8H_{15})_3$ and a second precursor compound $Zr(OC_3H_7)_4$, and
    (b) adding a catalyst to the mixture to provide a material solution of a required PH.

29. A method according to claim 1, wherein the material is NiO-YSZ, and the material solution is manufactured by the steps of:
    (a) mixing propanol (solvent) with a first precursor compound $Ni(NO_3)_2$ $6H_2O$ and $Zr(OC_3H_7)_4$ and a second precursor compound $Y(O_2C_8H_{15})_3$, and
    (b) adding a catalyst to the mixture to provide a material solution of a required pH.

30. A method according to claim 1, wherein the film has a thickness between a nm and approximately 100 $\mu$m.

31. A method according to claim 1, wherein the step of pressure feeding the material solution comprises the step of pumping the material solution.

32. A method of depositing a material onto a substrate, the method comprising the steps of:
    feeding a material solution comprising one or more precursor compounds, a solvent and a pH-modifying catalyst to an outlet disposed opposite the substrate to provide a stream of droplets of the material solution;
    generating an electric field electrostatically to attract the droplets from the outlet towards the substrate; and
    providing a temperature gradient between the outlet and the substrate;

wherein the feeding of the material solution, the electric field and the temperature gradient are configured such that the droplets one or both of decompose and react prior to reaching the substrate so as to form a powder.

33. A method of depositing a material onto a substrate, the method comprising the steps of:

feeding a material solution comprising one or more precursor compounds, a solvent and a pH-modifying catalyst to an outlet to provide a stream of droplets of the material solution;

generating an electric field electrostatically to attract the droplets from the outlet towards the substrate;

providing a temperature gradient between the outlet and the substrate;

cooling the material deposited on the substrate; and maintaining the electric field for at least a part of the time during which the deposited material is cooled.

34. A method of depositing a material onto a substrate, the method comprising the steps of:

pressure feeding a material solution comprising one or more precursor compounds, a solvent and a pH-modifying catalyst from a material solution supply to an outlet;

generating an electric field between the outlet and a substrate disposed opposite the outlet to provide a corona spray of droplets of the material solution and electrostatically guide the droplets from the outlet towards a surface of the substrate; and providing a decreasing temperature gradient from the surface of the substrate to the outlet, which temperature gradient is such that evaporation of the solvent from, and decomposition of, the droplets occurs as the droplets approach the substrate.

* * * * *